United States Patent
Idani

(10) Patent No.: US 8,658,529 B2
(45) Date of Patent: Feb. 25, 2014

(54) METHOD FOR MANUFACTURING SEMICONDUCTOR DEVICE

(75) Inventor: Naoki Idani, Kuwana (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/455,254

(22) Filed: Apr. 25, 2012

(65) Prior Publication Data

US 2012/0276736 A1 Nov. 1, 2012

(30) Foreign Application Priority Data

Apr. 28, 2011 (JP) ................................. 2011-100820

(51) Int. Cl.
    *H01L 21/768* (2006.01)
(52) U.S. Cl.
    USPC ....................................................... 438/622
(58) Field of Classification Search
    USPC ......... 438/597, 618, 620, 622, 631, 633, 637;
             257/E21.575, E21.58, E21.583, 257/E21.585
    See application file for complete search history.

(56) References Cited

U.S. PATENT DOCUMENTS

| | | | |
|---|---|---|---|
| 6,399,399 B2 * | 6/2002 | Yamamoto | 438/3 |
| 6,875,667 B2 * | 4/2005 | Iizuka et al. | 438/381 |
| 7,968,460 B2 * | 6/2011 | Kirby et al. | 438/667 |
| 8,426,308 B2 * | 4/2013 | Han et al. | 438/639 |
| 2002/0113237 A1 * | 8/2002 | Kitamura | 257/71 |
| 2009/0014888 A1 * | 1/2009 | Lee et al. | 257/774 |
| 2009/0045487 A1 * | 2/2009 | Jung | 257/621 |
| 2009/0160051 A1 * | 6/2009 | Lee | 257/737 |
| 2009/0278230 A1 * | 11/2009 | Komuro | 257/532 |
| 2009/0321796 A1 * | 12/2009 | Inohara | 257/288 |
| 2010/0084747 A1 * | 4/2010 | Chen et al. | 257/621 |
| 2010/0133660 A1 * | 6/2010 | Huyghebaert et al. | 257/621 |
| 2010/0178747 A1 * | 7/2010 | Ellul et al. | 438/386 |
| 2011/0316168 A1 * | 12/2011 | Moon et al. | 257/774 |
| 2011/0318923 A1 * | 12/2011 | Park et al. | 438/675 |
| 2012/0199970 A1 * | 8/2012 | Yun et al. | 257/737 |
| 2012/0319291 A1 * | 12/2012 | Chiou et al. | 257/774 |

FOREIGN PATENT DOCUMENTS

WO   2006/080337 A1   8/2006

* cited by examiner

*Primary Examiner* — Michele Fan
(74) *Attorney, Agent, or Firm* — Westerman, Hattori, Daniels & Adrian, LLP

(57) ABSTRACT

An oxide film is formed on an inner surface of a via hole in which a through electrode is to be formed, and thereafter a Cu film is embedded in the via hole. When an excess Cu film formed on a first interlayer insulating film is removed by a CMP method, the oxide film is also polished and reduced in thickness. Using the oxide film reduced in thickness as a hard mask, a wiring trench is formed in the first interlayer insulating film. At this time, the oxide film is further reduced in thickness. After a conductive material is embedded in the wiring trench, an excess conductive material is removed by polishing. At this time, the remaining oxide film is removed entirely by the polishing.

16 Claims, 16 Drawing Sheets

US 8,658,529 B2

METHOD FOR MANUFACTURING SEMICONDUCTOR DEVICE

CROSS-REFERENCE TO RELATED APPLICATION

This application is based upon and claims the benefit of priority of the prior Japanese Patent Application No. 2011-100820, filed on Apr. 28, 2011, the entire contents of which are incorporated herein by reference.

FIELD

The embodiments discussed herein are directed to a method for manufacturing a semiconductor device.

BACKGROUND

Among electronic components, there are ones having a semiconductor device in which a semiconductor element is formed. In the semiconductor device, for example, a semiconductor element and another circuit are formed on a silicon substrate. When a plurality of semiconductor devices are mounted on a circuit substrate of one electronic component, performance of the electronic component increases. Further, when a plurality of semiconductor devices are mounted on a circuit substrate in a stacked manner, the electronic component is made small. When semiconductor devices are stacked, a second semiconductor device is mounted on a first semiconductor device, and thereafter respective electrodes of the semiconductor devices are electrically connected to each other by wire bonding.

Thus, to mount a plurality of semiconductor devices in a stacked manner, electrodes of the semiconductor device on the lower side are formed at a position exposed from the semiconductor device on the upper side. Therefore, to stack the semiconductor devices using wire bonding, it is important to make the size of the semiconductor device on the upper side smaller than the size of the semiconductor device on the lower side. However, it is difficult to reduce the size of the semiconductor device on the lower side.

In recent years, a through-electrode (TSV, through-silicon via) penetrating a silicon substrate is formed in a semiconductor device. The through electrode has a structure in which a conductive material such as copper is embedded in a through hole penetrating a silicon substrate.

Here, a conventional method for forming a TSV will be described. First, wires of a first layer are formed over a silicon substrate. Subsequently, an interlayer insulating film is formed on the wires of the first layer. Thereafter, a via hole penetrating the interlayer insulating film and reaching a predetermined depth in the silicon substrate is formed by dry etching. After an insulating film is formed in the via hole, an adhesive layer and a seed layer are formed. Thereafter, metal is filled in the via hole by electrolytic plating. Metal remaining on the interlayer insulating film and the adhering layer are removed to expose a surface of the interlayer insulating film and a surface of the metal embedded in the via hole. An oxide film is formed on an inner wall of the via hole to secure the insulating property of the via hole, thereby preventing diffusion of metal embedded in the via hole.

Subsequently, wires are formed over the interlayer insulating film. Thereafter, a back surface side of the silicon substrate is dry-etched or wet etched to expose a back surface side of the through electrode. To an end surface of the exposed through electrode, a bump is joined. The through electrode is electrically connected to an electrode or the like of another semiconductor device via the bump.

When the through electrode is used for power supply or the like, it is necessary to make the thickness of the oxide film thick for allowing a large current to flow through the through electrode. However, when the thickness of the oxide film is large, it is difficult to securely remove an excess oxide film on the silicon substrate surface. This is because the polishing rate of the oxide film is low and it takes time for polishing. Moreover, evenness of the polishing is poor, and thus it is difficult to evenly remove the oxide film on the interlayer insulating film.

[Patent Document 1] International Publication No. WO2006/080337

SUMMARY

In a method for manufacturing a semiconductor device according to one aspect of the present embodiments, a semiconductor element is formed over one surface of a substrate; a first insulating film is formed over the semiconductor element; a hole penetrating the first insulating film is formed in the substrate; a second insulating film is formed over the first insulating film and on an inner surface of the hole; a first conductive material is embedded in the hole; the first conductive material and a part of the second insulating film over the first insulating film are removed by polishing; a pattern in the second insulating film and the first insulating film is formed by etching the second insulating film and the first insulating film; a second conductive material is embedded in the pattern; the second conductive film and the remaining second insulating film over the first insulating film are removed by polishing to expose the first insulating film; and a thickness of the substrate is reduced from the other surface to expose the first conductive material embedded in the hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

A method for manufacturing a semiconductor device of an embodiment will be described in detail with reference to the drawings.

Figure 1A:
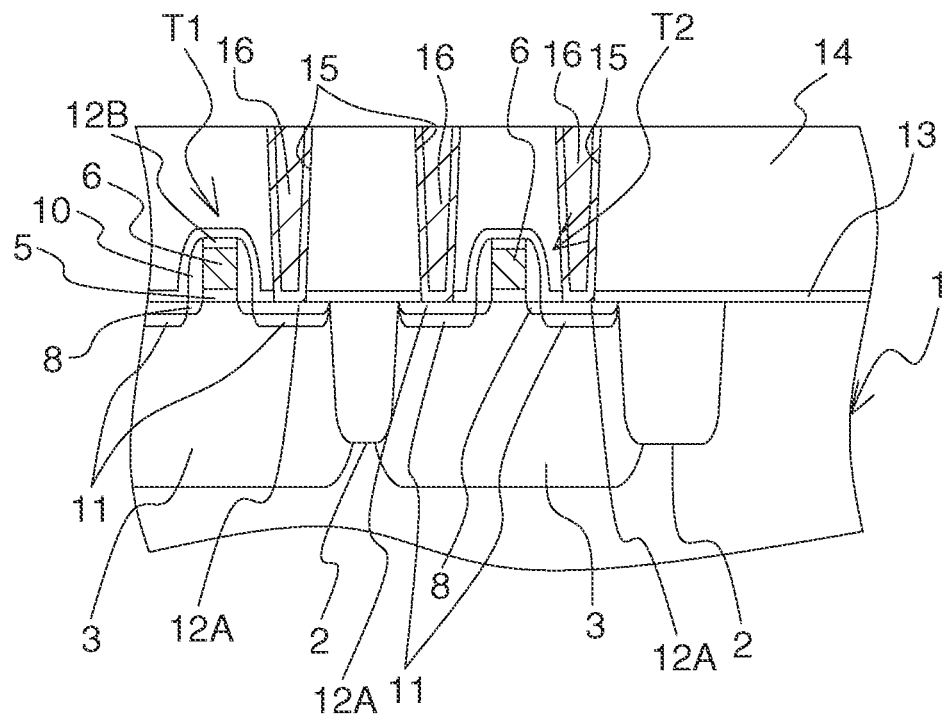
FIG. 1A to FIG. 1O are cross-sectional views illustrating an example of manufacturing processes of a semiconductor device according to a first embodiment.

First, processes up to obtaining a cross-sectional structure illustrated in FIG. 1A will be described.

First, one surface of an n-type or p-type silicon (semiconductor) substrate 1 is thermally oxidized to form an element isolation insulating film 2 to the depth of, for example, 30 nm, and an active region for transistor is defined with the element isolation insulating film 2. Such an element isolation structure is called LOCOS (Local Oxidation of Silicon). In the element isolation region, STI (Shallow Trench Isolation) may be used.

Next, a dopant impurity is introduced into the active region of the silicon substrate 1 by an ion implantation method to form a well. When p-type impurity, such as boron for example, is introduced as the dopant impurity, a p-well 3 is formed in the silicon substrate 1. After the p-well 3 is formed, the surface of the active region is thermally oxidized to form a gate insulating film 5. As the gate insulating film 5, for example, a thermally oxidized film is formed with a thickness of about 6 nm to 7 nm. Note that although the case where the p-well 3 is formed will be described below, similar processes are performed in the case where an n-well is formed in the silicon substrate 1.

Subsequently, over the entire upper surface of the silicon substrate 1, a polycrystalline silicon film is formed with a thickness of 20 nm using a CVD method for example. Thereafter, the polycrystalline silicon film is patterned using a photolithography technique and etching technique, so as to form gate electrodes 6 above the silicon substrate 1. The plural gate electrodes 6 are formed in parallel with each other above the p-well 3, each of them corresponding to a part of a word line.

Then, an ion is implanted into the p-well 3 with the gate electrodes 6 being a mask. For example, phosphorus is introduced as n-type impurity into the p-well 3 beside the gate electrodes 6. Thus, a first, second source/drain extensions 8 are formed. Each of the first, second source/drain extensions 8 corresponds to a shallow region of an extension source/drain region. Thereafter, over the entire upper surface of the silicon substrate 1, a silicon oxide film is formed as an insulating film with a thickness of 300 nm using the CVD method for example. Thereafter, the insulating film is anisotropically etched. The insulating film is etched back and an insulating side wall 10 is formed on a side part of each gate electrode 6.

Subsequently, using the insulating side walls 10 and the gate electrodes 6 as a mask, n-type dopant impurity such as arsenic is ion-implanted into the silicon substrate 1. Thus, source/drain diffusion layers 11 are formed in the p-well 3 beside the gate electrodes 6. Each of the source/drain diffusion layers 11 corresponds to a deep region of the extension source/drain.

Then, over an entire surface of the silicon substrate 1, for example, a refractory metal film such as a cobalt film is formed by sputtering. Thereafter, the refractory metal film is heated and brought into reaction with silicon. Thus, a refractory metal silicide layer such as a cobalt silicide layer is formed over the silicon substrate 1 in the source/drain diffusion layers 11, and resistance of each source/drain diffusion layer 11 is lowered. Thereafter, the refractory metal film remaining unreacted on the element isolation insulating film 2 and the like is removed by, for example, wet etching. Thus, source/drain electrodes 12A of, for example, a cobalt silicide are formed on the source/drain diffusion layers 11. Further, silicide layers 12B of, for example, a cobalt silicide are formed in upper portions of the gate electrodes 6.

Through the processes up to this point, in the active regions of the silicon substrate 1, transistors T1, T2 are formed, which are semiconductor elements including the gate insulating films 5, the gate electrodes 6, the source/drain electrodes 12A, and so on.

Further, over the entire upper side surface of the silicon substrate 1, a silicon oxynitride (SiON) film is formed as an oxidation preventing insulating film 13 by a plasma CVD method.

Furthermore, over the oxidation preventing insulating film 13, a silicon oxide ($SiO_2$) film is formed as an insulating film 14 with a thickness of about 300 nm by a plasma CVD method using TEOS (tetraethoxysilane) gas.

Subsequently, using a not-illustrated resist film as a mask, the oxidation preventing insulating film 13 and the insulating film 14 are etched to form contact holes 15. The contact holes 15 have a diameter of, for example, 0.25 μm. The contact holes 15 reach the source/drain electrodes 12A.

Then, conductive plugs 16 electrically connected to the source/drain electrodes 12A are formed in the contact holes 15. Specifically, first, a Ti (titanium) film with a thickness of 30 nm and a TiN film with a thickness of 20 nm are formed in order on an inner surface of each contact hole 15 by sputtering or the like, so as to make an adhesive film (glue film) having a two-layer structure. Next, a W (tungsten) film is grown on the adhesive film by the CVD method. The W film is formed so that the thickness thereof is, for example, 300 nm on the insulating film 14. Thus, the contact holes 15 are filled with the W film. Thereafter, the excess W film and adhesive film over the upper surface of the insulating film 14 are removed by a CMP method. Thus, one conductive plug 16 is formed in each contact hole 15.

Figure 1B:
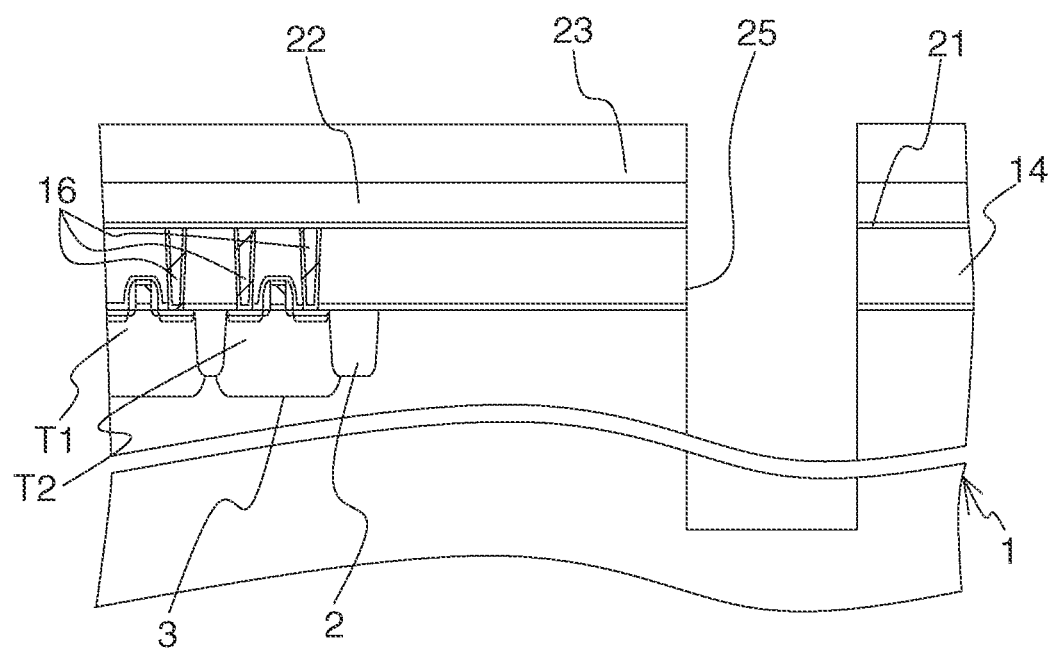

Next, processes until a cross-sectional structure illustrated in FIG. 1B is obtained will be described.

On the entire surface of the insulating film 14 and the conductive plugs 16, as an oxidation preventing insulating film 21, for example, an SiCN film is formed with a thickness of 30 nm by the plasma CVD method. A first interlayer insulating film 22 is formed as a first insulating film over the oxidation preventing insulating film 21. As the first interlayer insulating film 22, for example, an SiOC film is formed with a thickness of 150 nm by the plasma CVD method. The first interlayer insulating film 22 may be formed by using an SOG (Spin on Glass) method.

Next, resist material is applied so as to form a resist film on the entire surface of the first interlayer insulating film 22 by spin coating for example. Subsequently, the resist film is patterned to form a mask 23. Then, using the mask 23, the first interlayer insulating film 22, the oxidation preventing insulating film 21, the insulating film 14, and the silicon substrate 1 are etched in order, so as to form a via hole 25 for through electrode. The size of the via hole 25 is sufficiently large compared to the contact holes 15. For example, the via hole 25 has a width of 20 μm and a depth of several 10 μm. After the via hole 25 is formed, the mask 23 is removed by, for example, ashing.

Figure 1C:
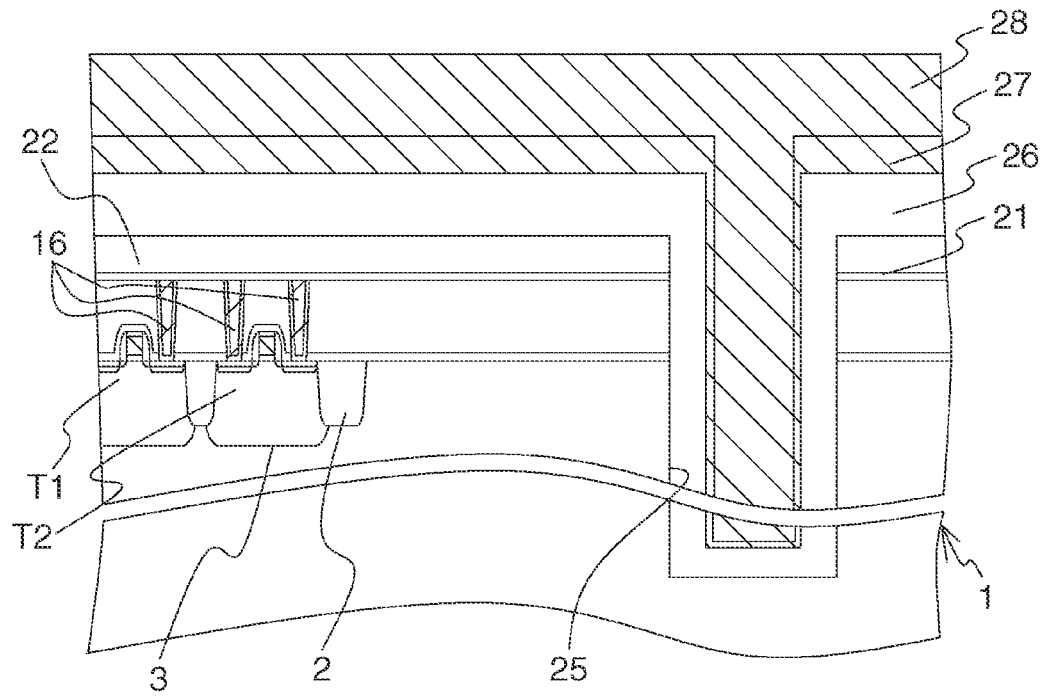

Next, processes until a cross-sectional structure illustrated in FIG. 1C is obtained will be described.

On the entire surface of the oxidation preventing insulating film 21 and an inner surface of the via hole 25, for example, an oxide film 26 as a second insulating film to be a barrier (or diffusion preventing) film is formed with a thickness of 200 nm by the plasma CVD method. At this time, the oxide film 26 is formed with a thickness of about 100 nm on the side wall of the via hole 25. The oxide film 26 prevents a conductive material embedded in the via hole 25 from diffusing into the silicon substrate 1. The oxide film 26 may be an SiN film formed by the plasma CVD method.

Then, for example, a TaN film 27 is formed with a thickness of 150 nm by sputtering so as to cover the oxide film 26. Thereafter, over the TaN film 27, a Cu film 28 is formed as a first conductive material with a thickness of, for example, 10 µm by plating. Thus, the Cu film 28 is embedded in the via hole 25.

Figure 1D:
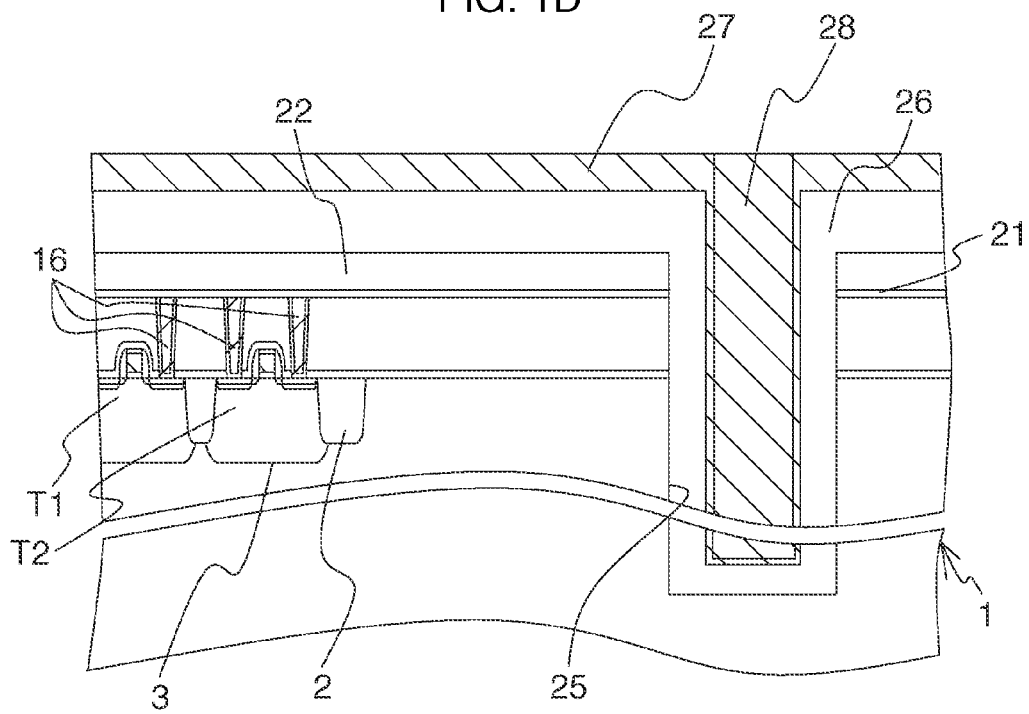

Subsequently, processes until a cross-sectional structure illustrated in FIG. 1D is obtained will be described.

The silicon substrate 1 is rotated by a spin coater while dripping a sulfuric acid/hydrogen peroxide solution onto a surface of the Cu film 28, so as to etch the Cu film 28 to a predetermined thickness, for example, a thickness of about 1 µm. Further, the remaining Cu film 28, TaN film 27, and oxide film 26 are polished by the CMP method.

Figure 1E:
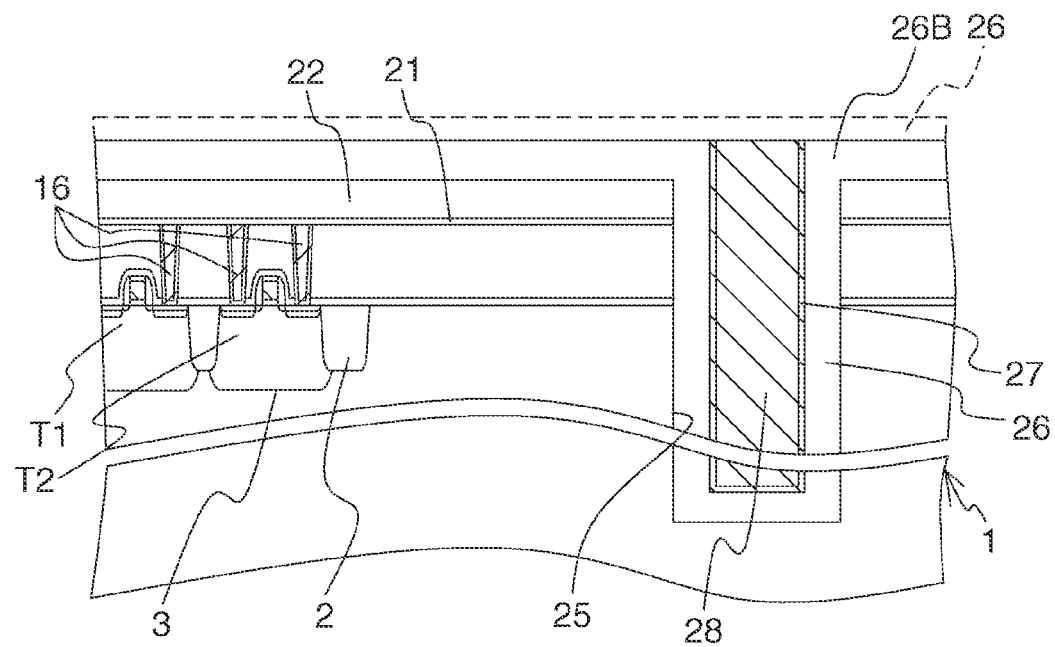

As illustrated by a dashed line in FIG. 1E, by the polishing using CMP, an upper part of the oxide film 26 is polished to reduce the film thickness. For example, the polishing is finished at a phase that the oxide film 26 is removed by about 50 nm, leaving an oxide film 26B of about 150 nm as a first film thickness for example above the silicon substrate 1. The polishing rate of the oxide film is about 50 to 70 nm/min, and thus in such a polishing method, a polishing amount of the oxide film 26 is about 50 nm, which needs a less polishing time. Further, although evenness of the polishing is about 5%, variation in film thickness of the surface of the oxide film 26B after the polishing is suppressed low since the polishing amount is small.

Figure 1F:
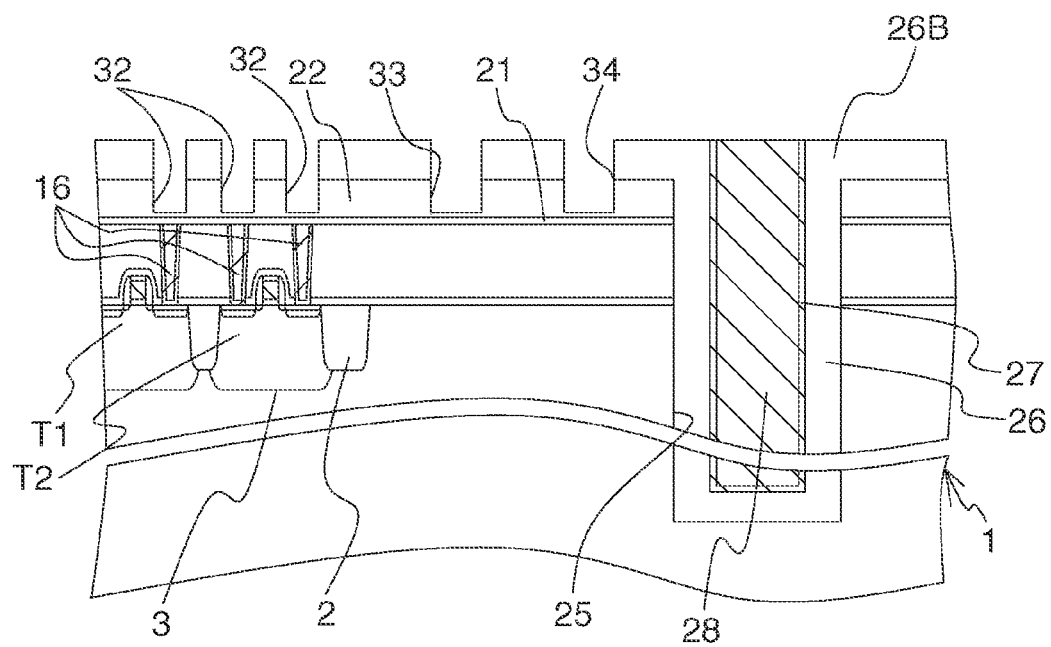

Further, processes until a cross-sectional structure illustrated in FIG. 1F is obtained will be described.

Over the oxide film 26B and the Cu film 28 in the via hole 25, resist material is applied so as to form a mask. Then, the oxide film 26B and the first interlayer insulating film 22 are dry-etched using the mask. Thus, a pattern having wiring trenches 32, 33, and 34 is formed in the first interlayer insulating film 22.

Figure 1G:
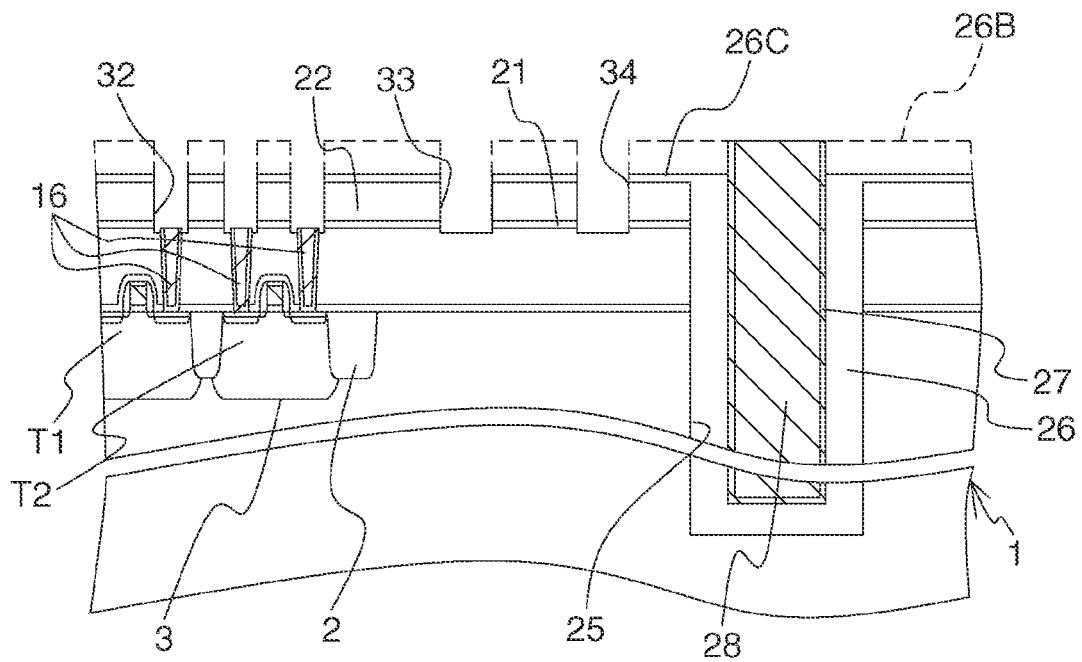

When the first interlayer insulating film 22 is dry-etched, the oxide film 26B may be used as a hard mask. As illustrated in FIG. 1G, in the dry etching, over-etching is performed downward from the first interlayer insulating film 22 for about 30 nm. Thus, the oxidation preventing insulating film 21 on bottom portions of the wiring trenches 32, 33, and 34 is removed completely. By the over-etching, part of the insulating film 14 is removed, thereby forming a recessed part in the insulating film 14. As a result, upper portions of the conductive plugs 16 are exposed. Further, in the etching, it is possible that the Cu film 28 and the TaN film 27 in the via hole 25 partly protrude.

In a case where the oxide film 26B is used as a hard mask for dry etching, the thickness of the oxide film 26B is reduced, and the oxide film 26B becomes an oxide film 26C of 20 nm to 50 nm as a second film thickness for example. The oxide film 26C is used as a hard mask, and thus plasma damage to the first interlayer insulating film 22 is suppressed.

Figure 1H:
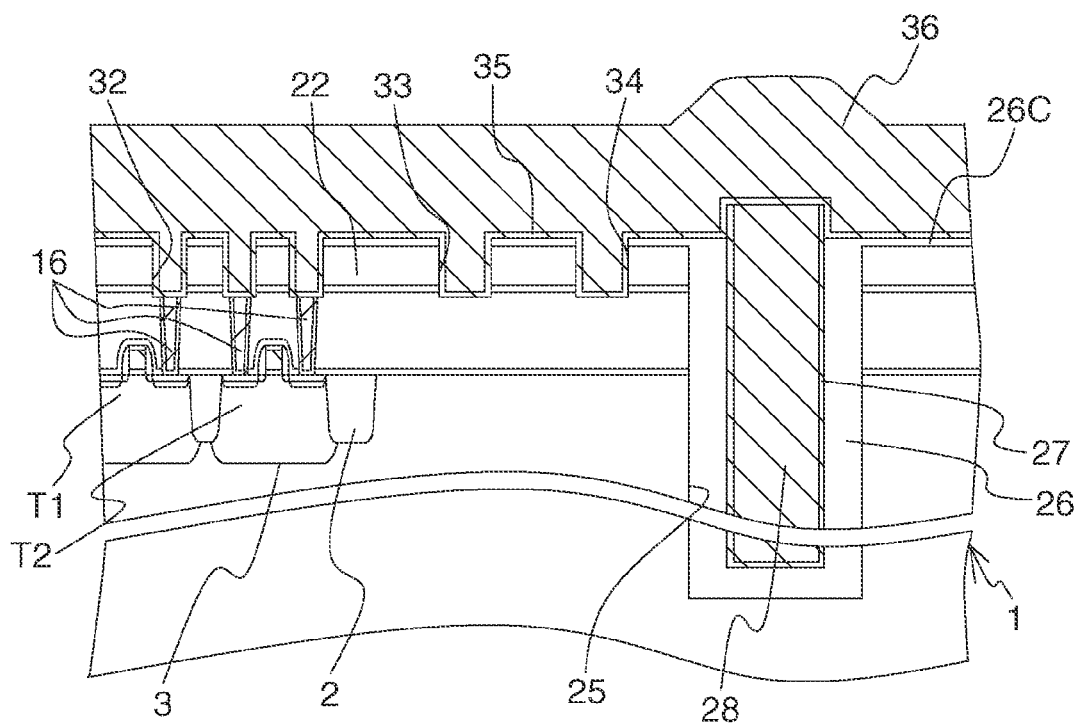

Subsequently, processes until a cross-sectional structure illustrated in FIG. 1H is obtained will be described.

First, on inner surfaces of the wiring trenches 32, 33, and 34, on upper end portions of the contact holes 15, and over the oxide film 26C, a TaN film 35 is formed with a thickness of about 8 nm by, for example, sputtering. Then, over the TaN film 35, a Cu film 36 as a second conductive material is formed by plating. The thickness of the Cu film 36 is, for example, 800 nm. Since the oxide film 26C is thin, an embedding failure of the Cu film 36 in the wiring trenches 32, 33, and 34 will not occur.

Figure 1I:
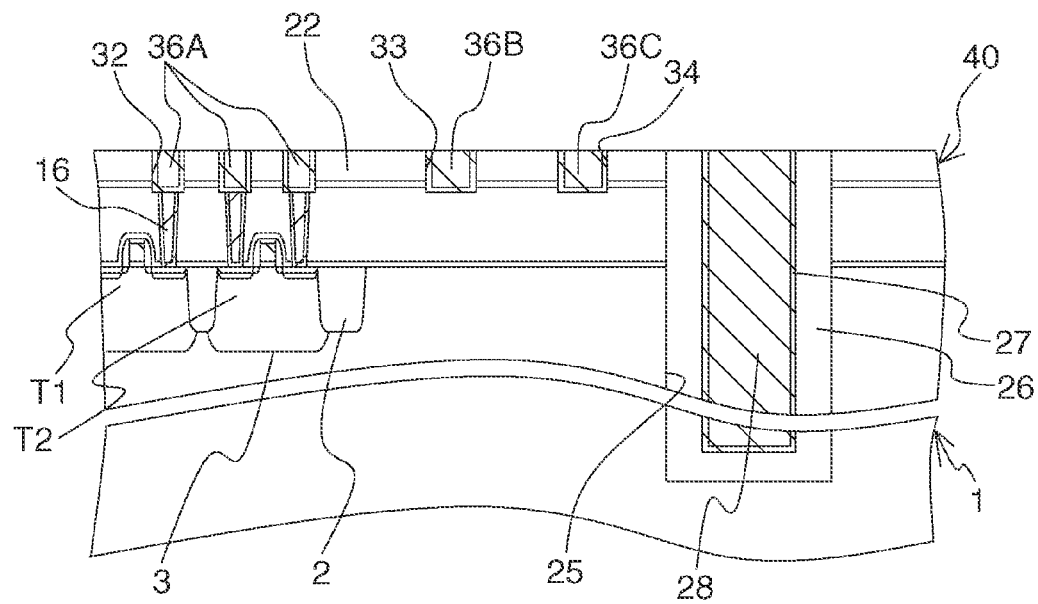

Further, processes until a cross-sectional structure illustrated in FIG. 1I is obtained will be described.

The Cu film 36, the TaN film 35, and the oxide film 26C are removed in order by the CMP method. At this time, the entire remaining oxide film 26C and the first interlayer insulating film 22 under the oxide film 26C are polished by about 20 nm. Through the processes up to this point, the thickness of the oxide film 26C is reduced to about 20 nm to 50 nm, and thus the oxide film 26C can be securely removed by a short polishing time. By this polishing, wires 36A, 36B, and 36C of a first layer are formed. The wires 36A are electrically connected to the conductive plugs 16. A first wiring layer 40 is obtained, in which the wires 36A, 36B, and 36C are embedded in the first interlayer insulating film 22 as a low dielectric film.

Figure 1J:
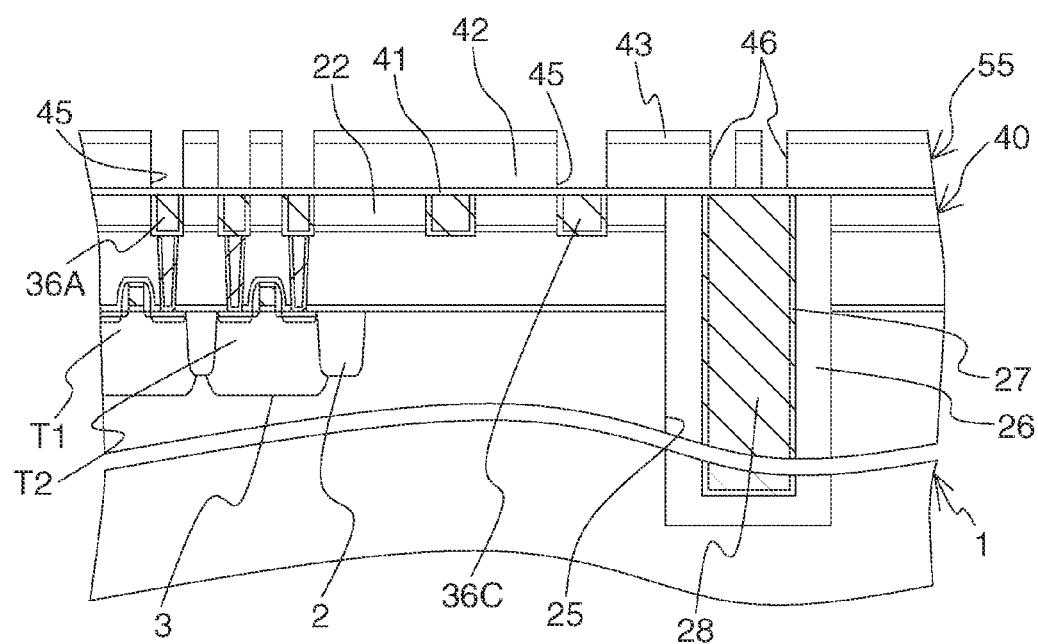

Next, processes until a cross-sectional structure illustrated in FIG. 1J is obtained will be described.

Over the first wiring layer 40, for example an SiCN film as an oxidation preventing insulating film 41 is formed with a thickness of about 30 nm by sputtering. Thereafter, over the oxidation preventing insulating film 41, for example an SiOC film as a second interlayer insulating film 42 is formed with a thickness of about 250 nm by the plasma CVD method. Over the second interlayer insulating film 42, an oxide film 43 is formed with a thickness of about 50 nm by the plasma CVD method.

Next, a resist film is formed on the oxide film 43. The resist film is patterned to form a mask, and using the mask the oxide film 43 and the second interlayer insulating film 42 are etched to form a plurality of via holes 45, and 46. The via holes 45 are formed above the wires 36A, and 36C. The via holes 45 are formed to reach the oxidation preventing insulating film 41. The via holes 46 are formed above the Cu film 28 embedded in the via hole 25. The via holes 46 are formed to reach the oxidation preventing insulating film 41. Two via holes 46 are formed in FIG. 1J, but the number of via holes 46 is not limited to two.

Figure 1K:
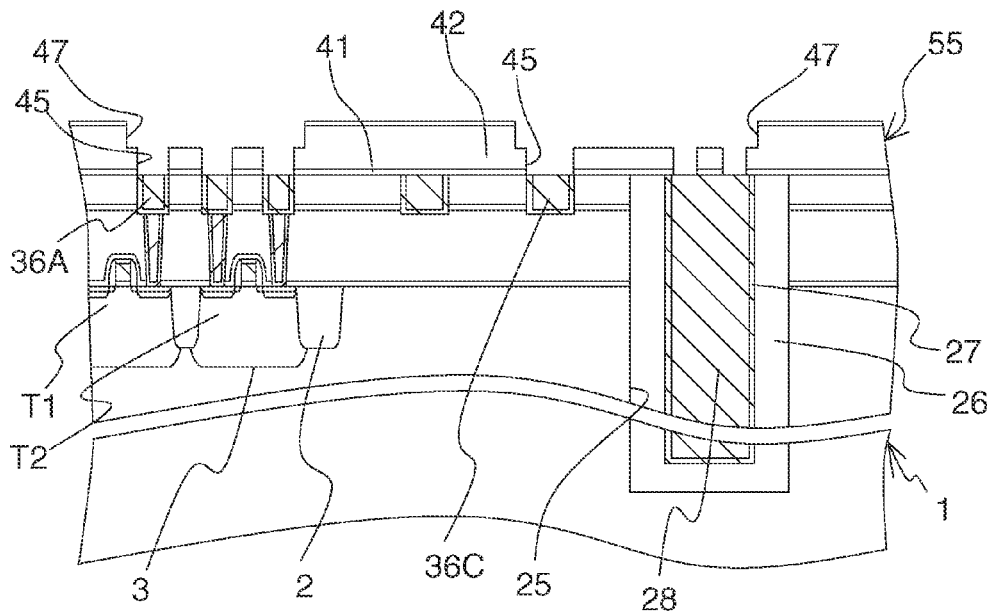

Next, processes until a cross-sectional structure illustrated in FIG. 1K is obtained will be described.

Resist material is applied so as to form a resist film on the via holes 45, and 46, and the entire surface of the oxide film 43. The resist film is patterned to form a mask corresponding to a wiring pattern. The second interlayer insulating film 42 is etched using the mask to form a second-layer wiring trench 47. In the etching, the oxide film 43 is used as a hard mask. The oxidation preventing insulating film 41 exposed on bottom portions of the via holes 45 is removed, and at least a part of the first-layer wires 36A, 36C and at least a part of the Cu film 28 are exposed.

Figure 1L:
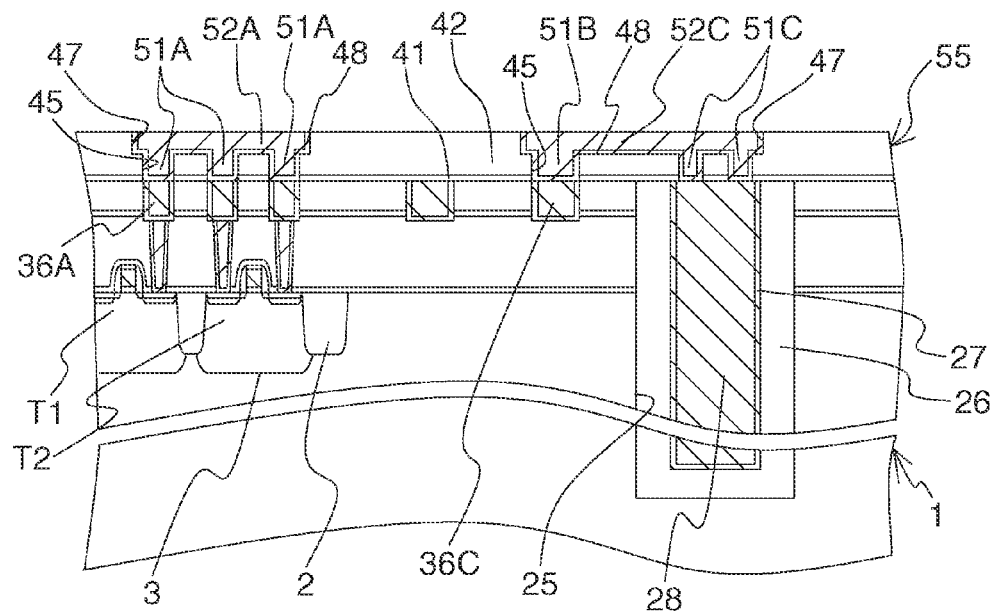

Next, processes until a cross-sectional structure illustrated in FIG. 1L is obtained will be described.

Over the wiring trench 47, the via hole 45, and the entire surfaces of the oxide film 43, a TaN film 48 as a barrier metal film is formed with a thickness of about 8 nm by, for example, sputtering. Further, a Cu film is formed over the TaN film 48 by plating. The thickness of the Cu film is, for example, 800 nm. Thereafter, the Cu film, the TaN film 48, and the oxide film 43 are removed in order by the CMP method. Thus, conductive plugs 51A, 51B, and 51C are formed in the via holes 45, and 46, and wires 52A, 52C are formed in the wiring trench 47. A second wiring layer 55 is obtained, in which the wires 52A, and 52C are embedded in the second interlayer insulating film 42 as a low dielectric film.

The wires 36A of the first layer 45 are electrically connected to the wire 52A of the second wiring layer 55 via the conductive plugs 51A. The wire 36C of the first layer 45 is electrically connected to the wire 52C of the second wiring layer 55 via the conductive plug 51B. The wire 52C is also electrically connected to the Cu film 28 embedded in the via hole 25 via the plurality of conductive plugs 51C. For example, when the Cu film 28 embedded in the via hole 25 is used to form a through electrode, and the through electrode is used as an electrode for power supply, the power is supplied to the wire 36C of the first layer 45 via the wire 52C of the second wiring layer 55 and the conductive plug 51B.

Figure 1M:
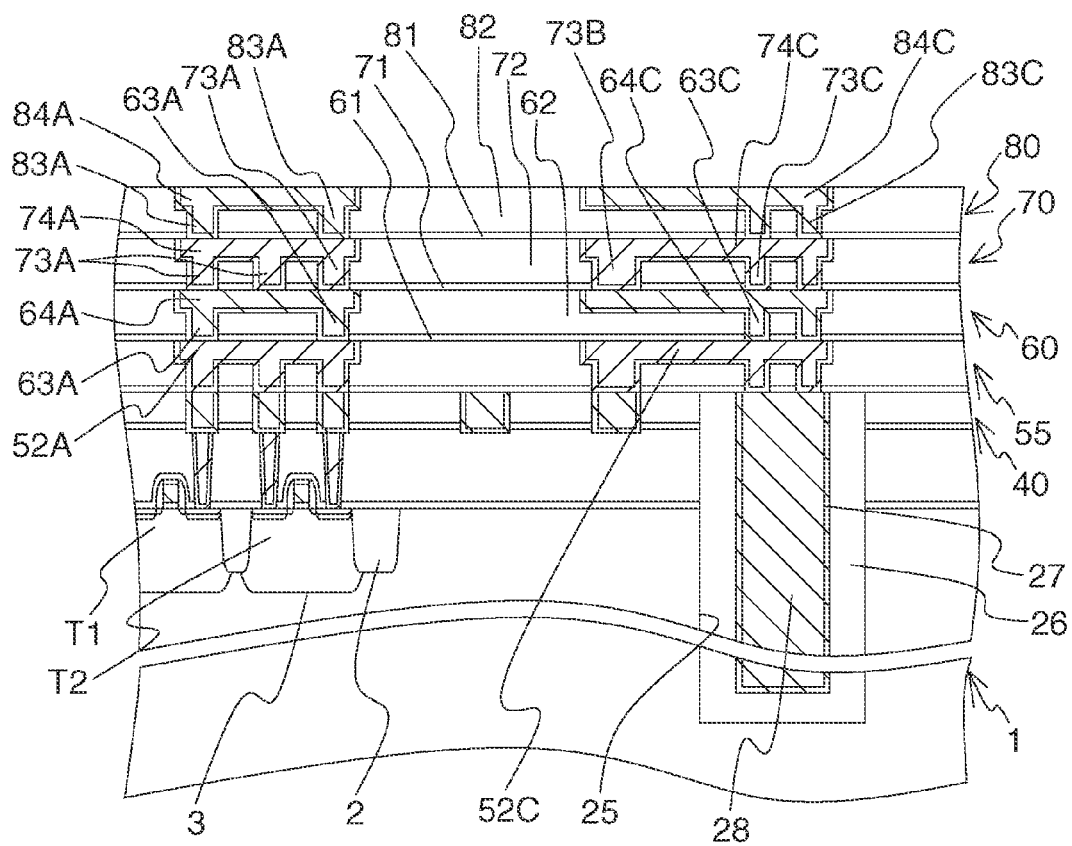

Next, processes until a cross-sectional structure illustrated in FIG. 1M is obtained will be described.

First, a third wiring layer 60 is formed over the second wiring layer 55. In forming the third wiring layer 60, first an oxidation preventing insulating film 61 is formed. Next, over the oxidation preventing insulating film 61, a third interlayer insulating film 62 is formed in the same manner as described above. In the third interlayer insulating film 62, conductive plugs 63A, and 63C electrically connected to the second wires 52A, and 52C of the lower layer, and third wires 64A, and 64C electrically connected to the conductive plugs 63A, and 63C are formed. A method for forming the third wiring layer 60 is the same as that for the second wiring layer 55.

Moreover, over the third wiring layer 60, a fourth wiring layer 70 is formed. An oxidation preventing insulating film 71 is formed first in forming the fourth wiring layer 70. Next, a fourth interlayer insulating film 72 is formed over the oxidation preventing insulating film 71. In the fourth interlayer insulating film 72, conductive plugs 73A, 73B, and 73C electrically connected to the third wires 64A, and 64C of the lower layer, and fourth wires 74A, and 74C connected to the third wires 64A, and 64C via the conductive plugs 73A, 73B, 73C are formed.

Moreover, over the fourth wiring layer 70, a fifth wiring layer 80 is formed. An oxidation preventing insulating film 81 is formed first in forming the fifth wiring layer 80. A fifth interlayer insulating film 82 is formed over the oxidation preventing insulating film 81. In the fifth interlayer insulating film 82, conductive plugs 83A, and 83B electrically connected to the fourth wires 74A, and 74B of the lower layer, and fifth wires 84A, and 84C electrically connected to the conductive plugs 83A, and 83C are formed. The number of conductive plugs 63C, 73C, and 83C formed above the via hole 25 are not limited to two each.

Figure 1N:
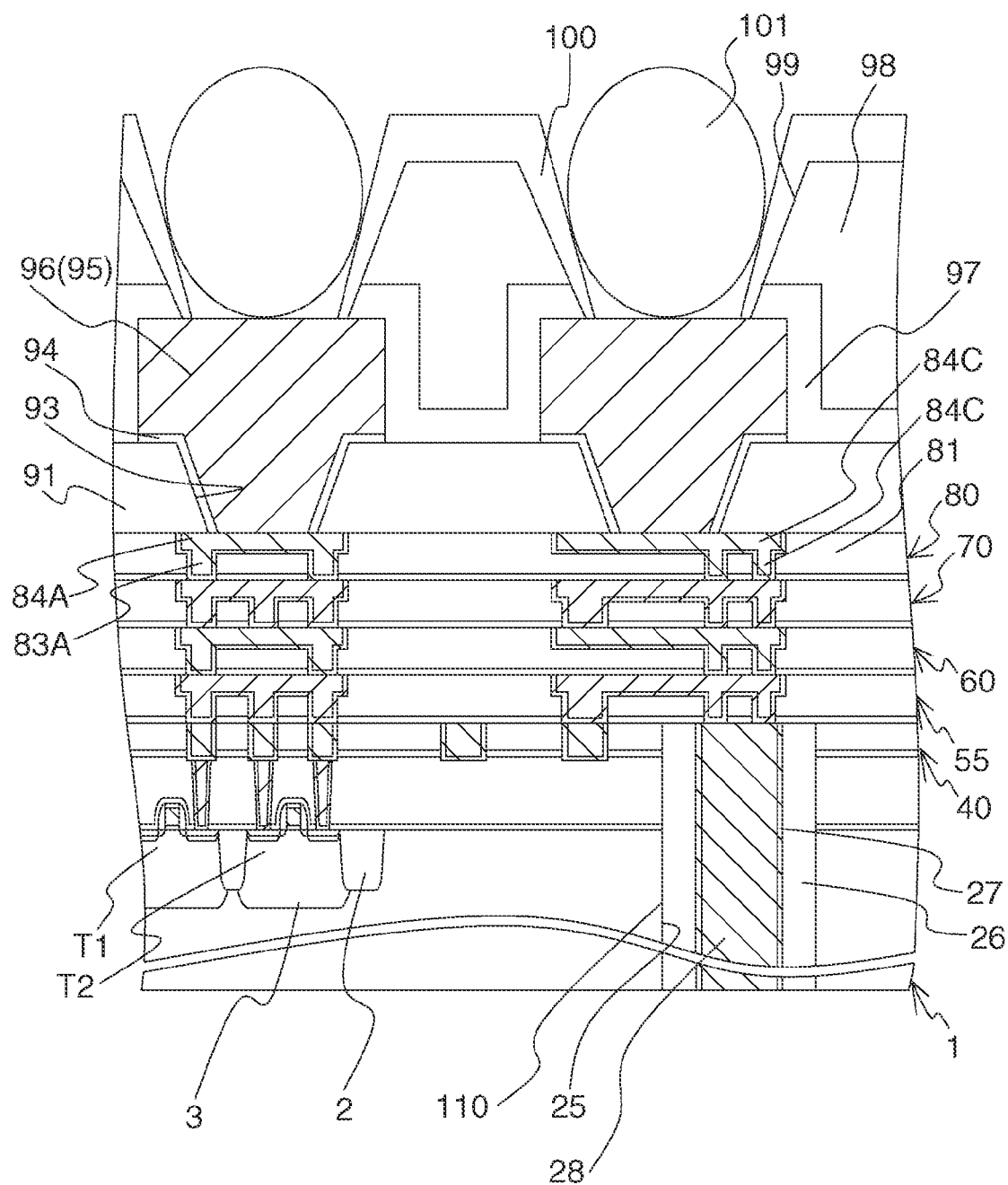

Subsequently, processes until a cross-sectional structure illustrated in FIG. 1N is obtained will be described.

Over the fifth wiring layer 80, an oxide film 91 is formed with a thickness of about 1 μm using, for example, the plasma CVD method. Further, resist material is applied so as to form a resist film on the oxide film 91, and the resist film is patterned to form a mask. The oxide film 91 is etched using the mask to form via holes 93.

Over the entire surface of the oxide film 91, in which the via holes 93 are formed, a layered film 94 of a Ta film, a Ti film, and a TiN film, for example, is formed. The layered film 94 has a Ta film with a thickness of 10 nm, a Ti film with a thickness of 20 nm, and a TiN film with a thickness of 20 nm in this order from a lower side. The Ta film, the Ti film, and the TiN film are formed by, for example, sputtering. Then, an Al film 95 is formed with a thickness of 1.5 μm using sputtering for example, so as to embed the via holes 93.

Resist material is applied so as to form a resist film on the Al film 95, and thereafter the resist film is patterned to form a mask. Further, the Al film 95 is etched using the mask to form wires 96 of Al. Over the wires 96 of Al and the oxide film 91, an SiN film 97 is formed with a thickness of about 200 nm by, for example, the plasma CVD method. Over the SiN film 97, an SiO film 98 is formed with a thickness of about 1.5 μm by, for example, the plasma CVD method. Resist material is applied so as to form a resist film on the SiO film 98, and thereafter the resist film is patterned to form a mask. Then, the SiO film 98 is etched using the mask to form via holes 99. Further, while rotating the silicon substrate 1 by a spin coater, a polyimide resin is applied on the SiO film 98 and the wires 96 and then cured to form a polyimide film 100. Thereafter, the polyimide film 100 is patterned using a mask formed of a resist film. Furthermore, bumps 101 are formed in the via holes 99. Thus, wires 84A, and 84C of a portion of the fifth wiring layer 80 are electrically connected to the bumps 101 via the wires 96 containing Al.

Thereafter, a back surface, which is another surface of the silicon substrate 1, is polished with a back grinder. The polishing is performed until the Cu film 28 in the via hole 25 is exposed on the back surface of the silicon substrate 1. Thus, a through electrode 110 penetrating the silicon substrate 1 is obtained.

Figure 1O:
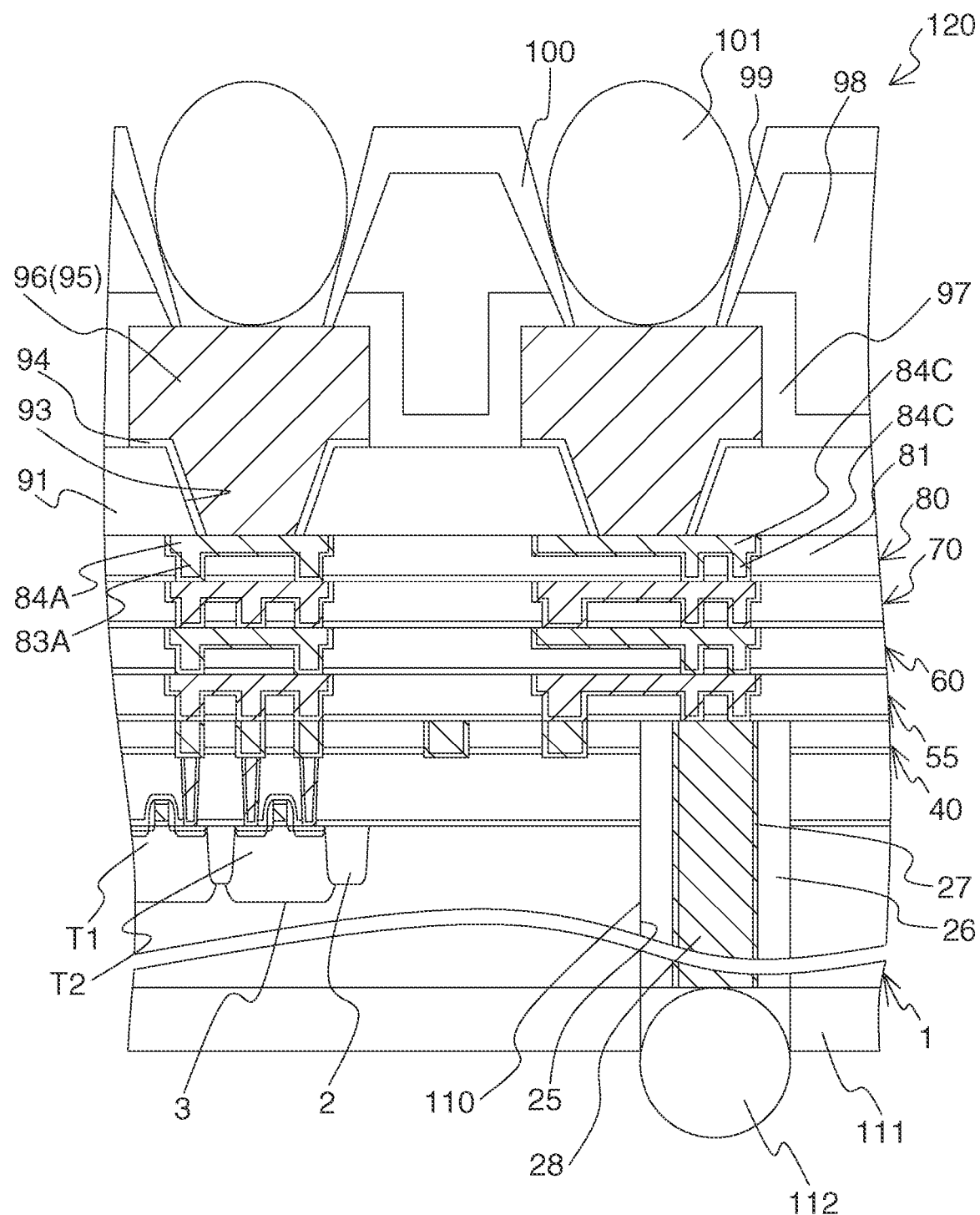

Next, processes until a cross-sectional structure illustrated in FIG. 1O is obtained will be described.

A polyimide resin is applied on the entire back surface of the silicon substrate 1 and cured to form a polyimide layer 111. Further, the polyimide layer 111 is patterned to expose the through electrode 110, and thereafter a bump 112 is electrically connected to an end surface of the back surface side of the through electrode 110. Thus, a semiconductor device 120 is manufactured.

When the semiconductor device 120 is stacked on another semiconductor device or a circuit substrate, the bump 112 on the lower side is used to mount it on an electrode of the semiconductor device or the circuit substrate. When another semiconductor device is mounted on the semiconductor device 120, the bumps 101 on the upper side are used.

When the through electrode 110 is used for power supply, power can be supplied directly to each layer of the second wiring layer 55 to the fifth wiring layer 80 via the plurality of conductive plugs 51C, 63C, 73C, 83C. To the first wiring layer 40, power is supplied via the second wiring layer 55.

As has been described above, in this method for manufacturing a semiconductor device, the thickness of the oxide film 26 formed on the first interlayer insulating film 22 is reduced in steps through the processes of forming the through electrode 110, and is finally removed by polishing. Thus, there are prevented remaining of the oxide film 26 on the first interlayer insulating film 22 and over etching of the first interlayer insulating film 22. For example, when a circuit is formed on the silicon substrate 1 with the oxide film 26 remaining thereon, the depth of the wiring trenches 32 to 34 is the sum of the original thickness of the first interlayer insulating film 22 and the thickness of the remaining oxide film 26. In this case, there arises a possibility that the Cu film 36 is not embedded sufficiently in the wiring trenches 32 to 34. Further, when the wiring trenches 32 to 34 become deep due to remaining of the oxide film 26, the volume of the Cu film 28 embedded in the wiring trenches 32 to 34 becomes large, and it is possible that the capacity between the wires increases. In the present embodiment, the wiring trenches 32 to 34 will not become too deep, and hence the wires can be embedded securely. Further, the capacity between the wires will not increase.

Here, modification examples of this embodiment will be described.

Figure 2:
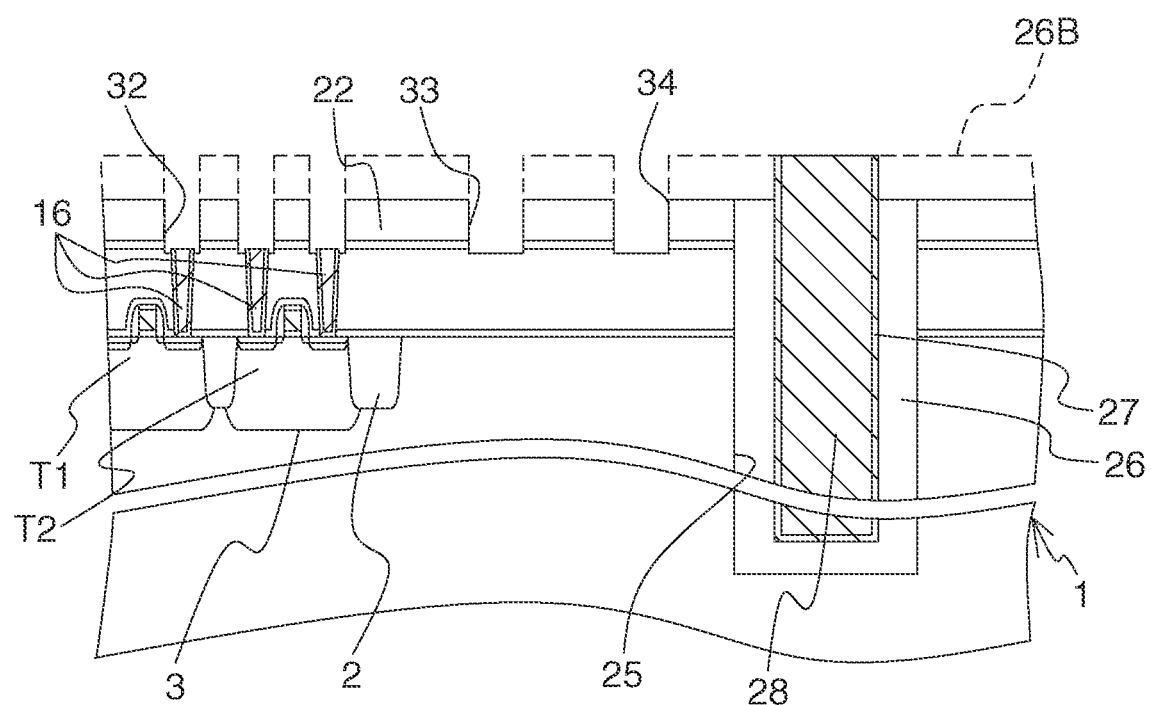
FIG. 2 is a cross-sectional view illustrating a manufacturing process of a semiconductor device according to a modification example of the first embodiment.

As illustrated in FIG. 2, when the wiring trenches 32 to 34 are formed by dry-etching, the oxide film 26B may be removed entirely. That is, the oxide film 26B and the first interlayer insulating film 22 are dry-etched to form the wiring trenches 32 to 34. At this time, the first interlayer insulating film 22 is over-etched to expose the upper end portions of the conductive plugs 16, and to remove the entire oxide film 26.

Further, when the wiring trenches 32 to 34 are formed as illustrated in FIG. 1G, the etching may be finished without decreasing the thickness of the oxide film 26B, and the oxide film 26B may be removed by the polishing after the Cu film 36 is embedded in the wiring trenches 32 to 34. For example, when an embedding failure of the Cu film 36 will not occur such as when the wiring trenches 32 to 34 are wide and/or shallow, increase in capacity between wires may be prevented.

Figure 3:
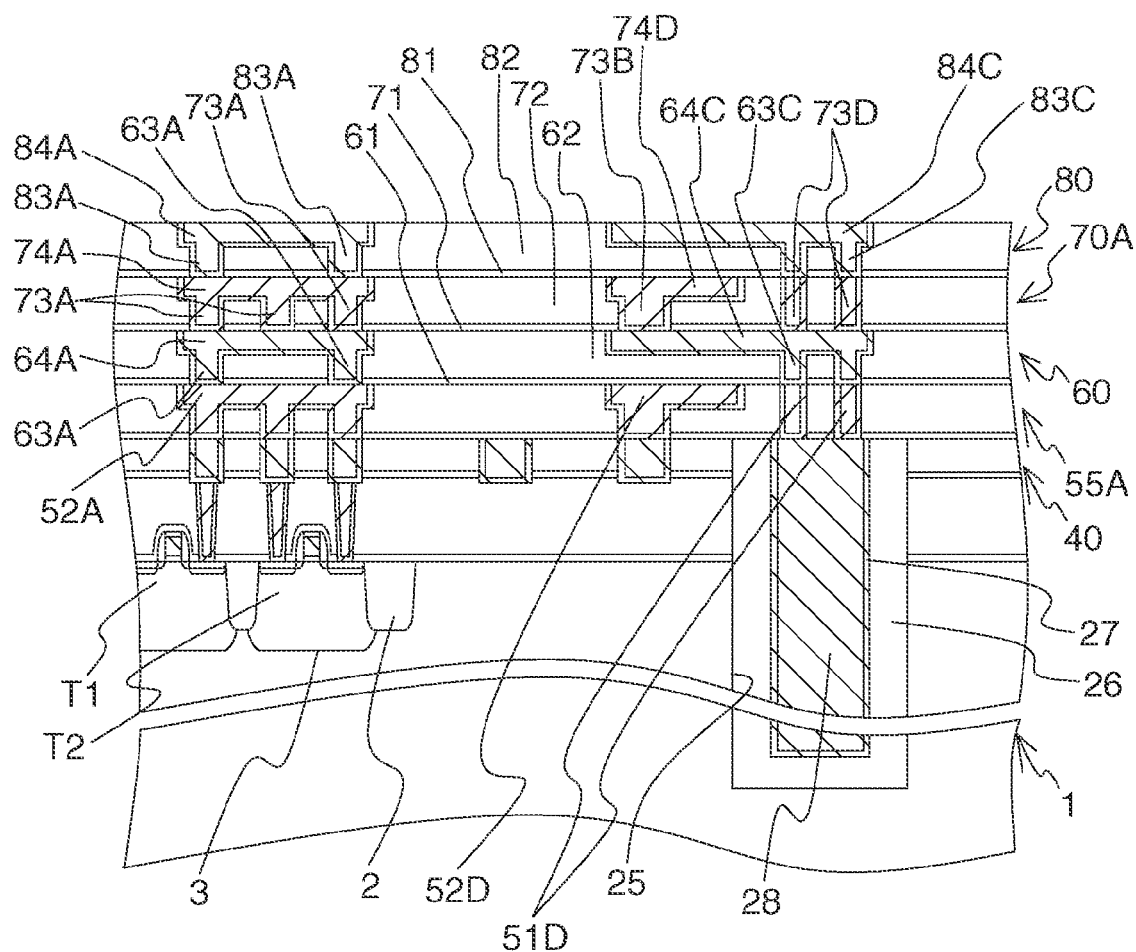
FIG. 3 is a cross-sectional view illustrating a manufacturing process of a semiconductor device according to another modification example of the first embodiment.

Further, as illustrated in FIG. 3, the Cu film 28 in the via hole 25 may not be connected directly to the second wiring layer 55A. In this case, first, transistors T1, and T2 as semiconductor elements are formed on the silicon substrate 1, and thereafter a first wiring layer 40 is formed. Then, a via hole 25 is formed in the silicon substrate 1, an oxide film 26 is formed on an inner wall of the via hole 25, and thereafter a Cu film 28 is embedded in the via hole 25. Subsequently, a second wiring layer 55A is formed over the first wiring layer 40. The second wiring layer 55A has wires 52A, and 52D. Further, a plurality of conductive plugs 51D are formed, which are electrically connected to the Cu film 28 in the via hole 25. Thereafter, over the second wiring layer 55A, a third wiring layer 60 is formed. In the third wiring layer 60, a wire 64C is electrically connected to the Cu film 28 in the via hole 25 via the conductive plugs 51D. In this modification example, the through electrode 110 including the Cu film 28 embedded in the via hole 25 is not connected directly to the wires 52A, and 52D of the second wiring layer 55A. On the other hand, the wire 64C of the third wiring layer 60 is electrically connected to the through electrode 110 via the conductive plugs 51D, and 63C.

Further, the wires 74A, and 74D of the fourth wiring layer 70A are not connected directly to the Cu film 28 in the via hole 25. On the other hand, the wire 84C of the fifth wiring layer 80 is electrically connected to the through electrode 110 via the conductive plugs 51D, 63C, 73D, and 83C. Therefore, in the example illustrated in FIG. 3, only the wire 64C of the third wiring layer 60 and the wire 84C of the fifth wiring layer 80 are connected directly to the Cu film 28 in the via hole 25. Thus, the through electrode 110 is connected to at least one wire of a multi-layer wiring structure formed above the silicon substrate 1. In such a modification example, effects similar to the above-described ones can be obtained.

Second Embodiment

A second embodiment will be described in detail with reference to the drawings. Elements similar to those of the first embodiment are denoted by same reference numerals. Further, descriptions overlapping with the first embodiment are omitted.

Figure 4A:
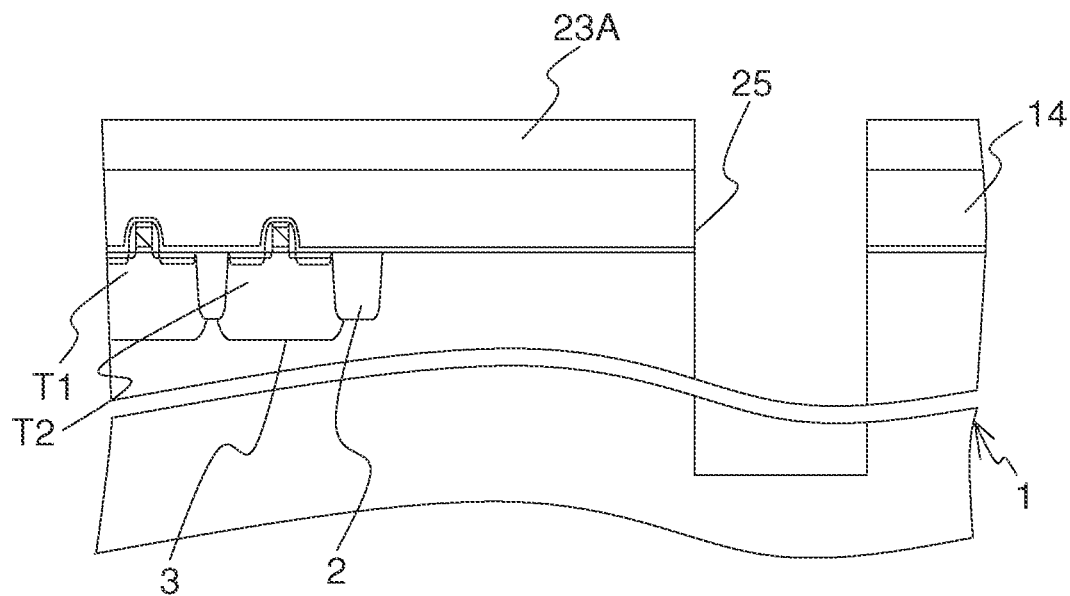
FIG. 4A to FIG. 4H are cross-sectional views illustrating an example of manufacturing processes of a semiconductor device according to a second embodiment.

First, processes until a cross-sectional structure illustrated in FIG. 4A may be obtained will be described.

In a silicon substrate 1, transistors T1, and T2, which are semiconductor elements, are formed. Further, an insulating film 14 as a first insulating film is formed so as to cover the silicon substrate 1 and the transistors T1, and T2. Thereafter, a mask 23A having a resist film is formed over the entire surface of the insulating film 14. Then, the insulating film 14 and the silicon substrate 1 are dry-etched using the mask 23A to form a via hole 25 for through electrode. The size of the via hole 25 is such that, for example, the width thereof is 20 μm and the depth thereof is 10 μm. After the via hole 25 is formed, the mask 23A is removed by, for example, ashing.

Figure 4B:
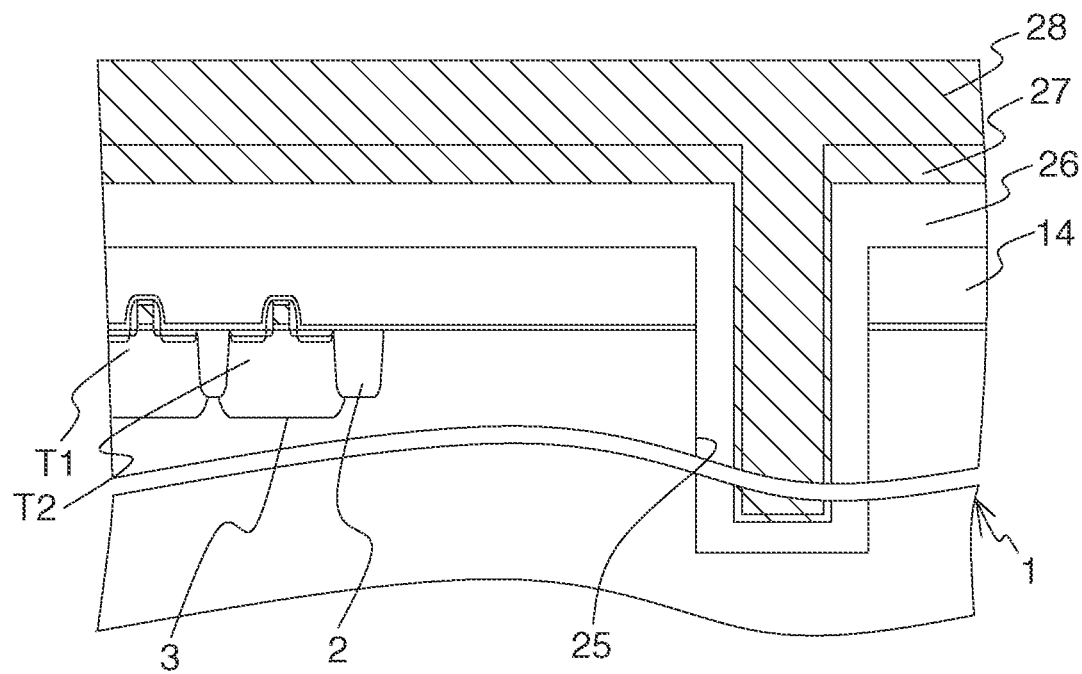

As illustrated in FIG. 4B, for example an oxide film 26 as a barrier film is formed with a thickness of 200 nm by the plasma CVD method over the entire surface of the insulating film 14 and an inner surface of the via hole 25. In this case, on a side wall of the via hole 25, the oxide film 26 is formed with a thickness of about 100 nm. The oxide film 26 may be an SiN film formed by the plasma CVD method.

Then, for example, a TaN film 27 is formed with a thickness of 150 nm by sputtering so as to cover the oxide film 26. Thereafter, over the TaN film 27, a Cu film 28 is formed with a thickness of, for example, 10 μm by plating. Thus, the Cu film 28 is embedded in the via hole 25.

Figure 4C:
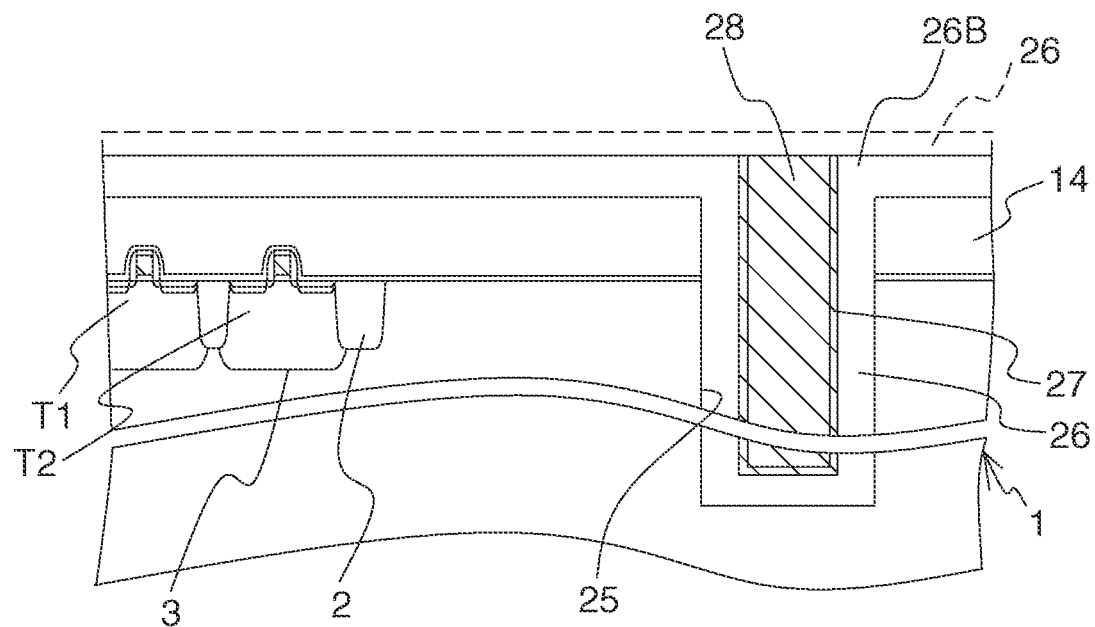

Subsequently, processes until a cross-sectional structure illustrated in FIG. 4C is obtained will be described.

First, the silicon substrate 1 is rotated by a spin coater while dripping a sulfuric acid/hydrogen peroxide solution onto a surface of the Cu film 28, so as to etch the Cu film 28 to a predetermined thickness, for example, a thickness of about 1 μm. Further, the remaining Cu film 28, TaN film 27, and oxide film 26 are polished by the CMP method. As illustrated by a dashed line in FIG. 4C, by the polishing using CMP, the oxide film 26 is polished from an upper side to reduce the film thickness. For example, the polishing is finished at a phase that the oxide film 26 is removed by about 50 nm, leaving an oxide film 26B of about 150 nm for example above the silicon substrate 1.

Figure 4D:
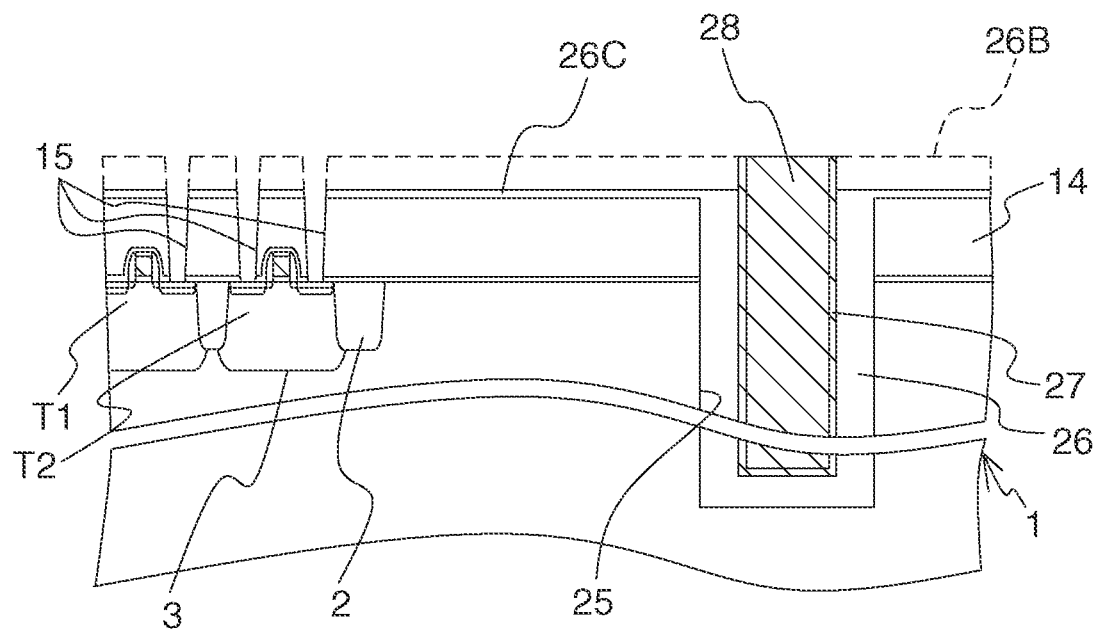

Further, processes until a cross-sectional structure illustrated in FIG. 4D is obtained will be described.

First, the oxide film 26B and the insulating film 14 are dry-etched to form a pattern including contact holes 15. The contact holes 15 have a diameter of, for example, 0.25 μm. The contact holes 15 are formed to reach the source/drain electrodes 12A. The dry etching is performed using a not-illustrated mask formed over the oxide film 26B. Further, the oxide film 26B is used as a hard mask of the dry etching. Thus, an oxide film 26C whose thickness is reduced to, for example, 20 nm to 50 nm is formed from the oxide film 26B. The oxide film 26C is used as a hard mask, and thus plasma damage to the insulating film 14 is suppressed.

Figure 4E:
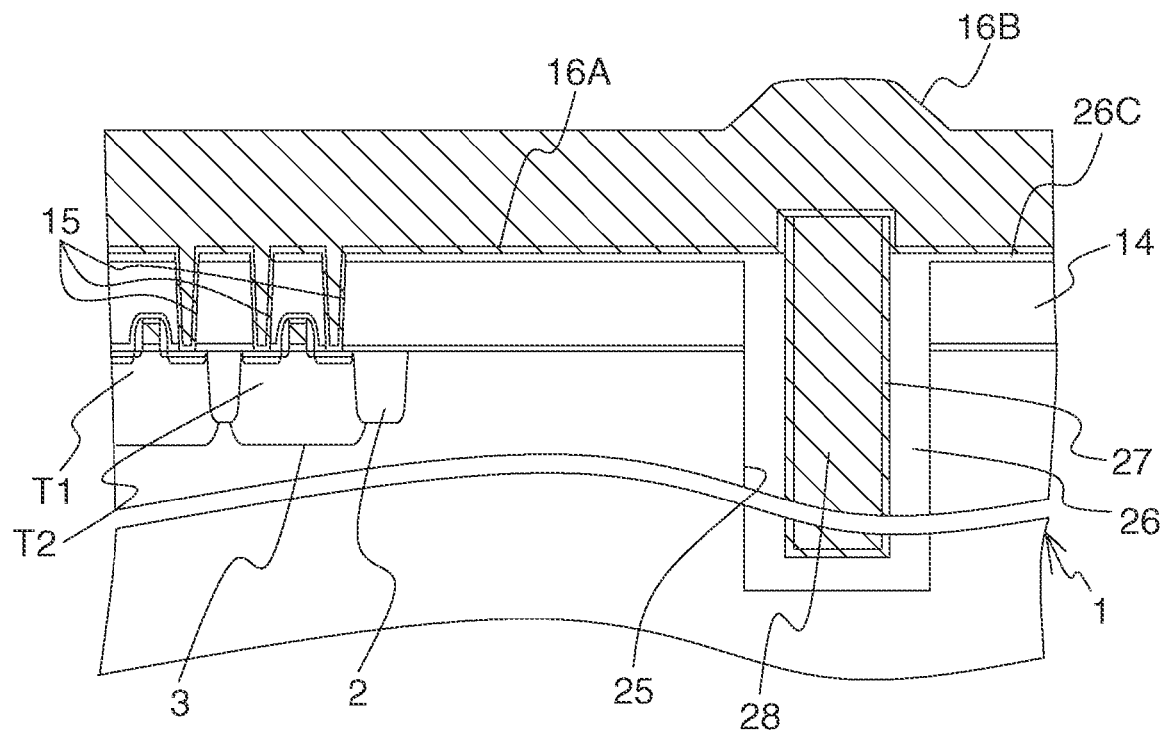

Next, as illustrated in FIG. 4E, on inner surfaces of the contact holes 15 and over the oxide film 26C and the Cu film 28, for example, an adhesive film 16A is formed with a thickness of 150 nm by sputtering. Thereafter, over the adhesive film 16A, a W (tungsten) film 16B as a second conductive material is formed with a thickness of, for example, 10 μm. The W film 16B may be formed by plating. Thus, the W film 16B is embedded in the via hole 25. Accordingly, the contact holes 15 are filled with the W film 16B.

Figure 4F:
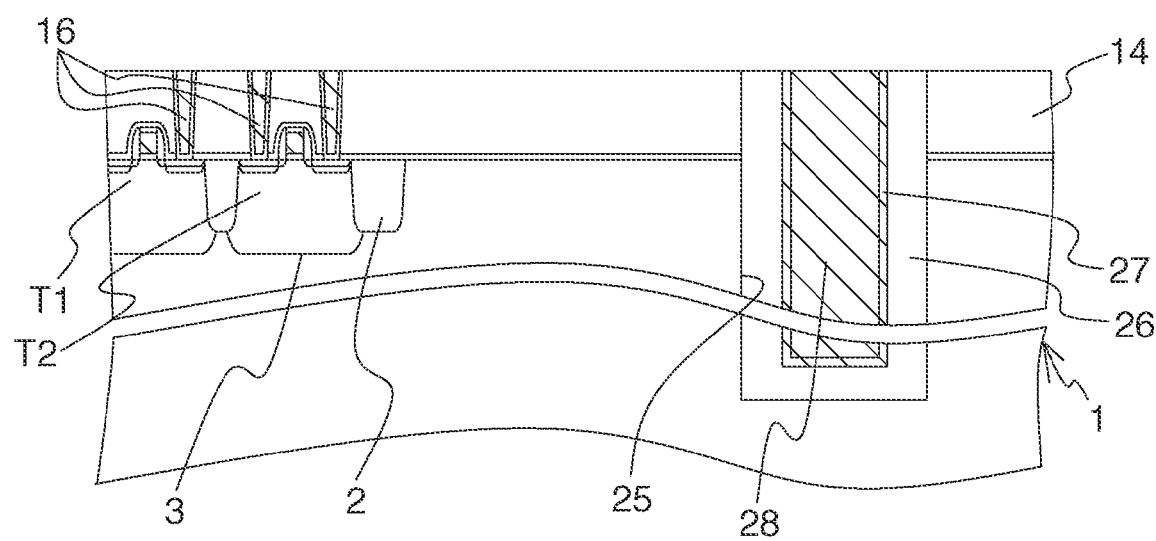

Thereafter, as illustrated in FIG. 4F, the excess W film 16B and adhesive film 16A over the upper surface of the insulating film 14 are removed by the CMP method. At this time, the entire remaining oxide film 26C and the insulating film 14 under the oxide film 26C are polished by about 20 nm. Through the processes up to this point, the thickness of the oxide film 26C is reduced to about 20 nm to 50 nm, and thus the oxide film 26C can be securely removed by a short polishing time. Through the processes up to this point, one conductive plug 16 is formed in each contact hole 15.

Figure 4G:
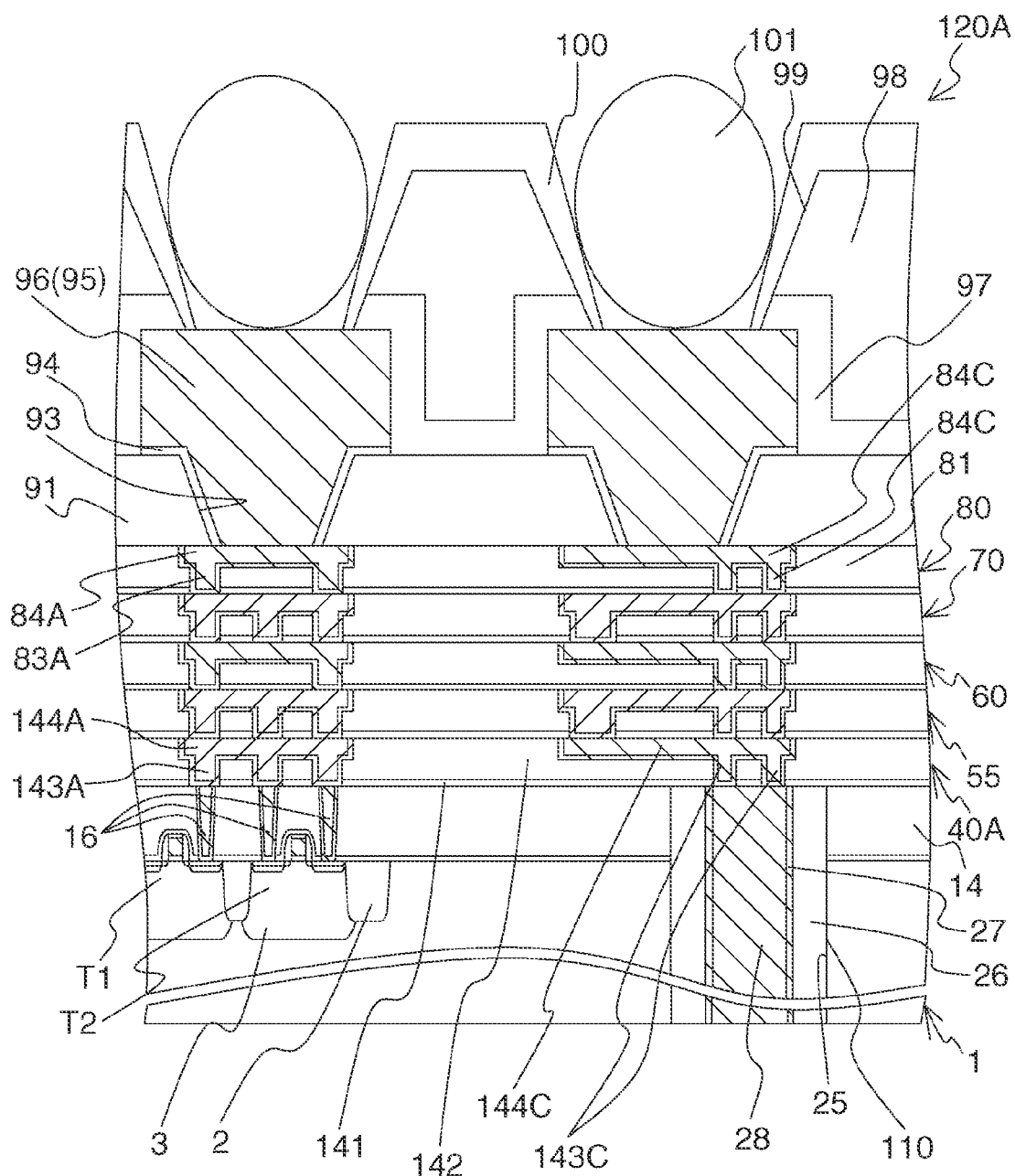

Next, processes until a cross-sectional structure illustrated in FIG. 4G is obtained will be described.

A first wiring layer 40A is formed over the insulating film 14. In forming the first wiring layer 40A, first, an oxidation preventing insulating film 141 is formed. Over the oxidation preventing insulating film 141, a first interlayer insulating film 142 is formed. In the first interlayer insulating film 142, conductive plugs 143A, and 143C electrically connected to the conductive plugs 16 and the Cu film 28 of the via hole 25, and first wires 144A, and 144C are formed. Thereafter, a second wiring layer 55, a third wiring layer 60, a fourth wiring layer 70, and a fifth wiring layer 80 are formed in order.

Further, an oxide film 91 is formed over the fifth wiring layer 80. The oxide film 91 is etched to form via holes 93.

Over the entire surface of the oxide film 91, in which the via holes 93 are formed, a Ta film, a Ti film, and a TiN film, for example, is formed in order by sputtering to form a layered film 94. Further, an Al film 95 is formed using sputtering for example, so as to embed the via holes 93. The Al film 95 is etched to form wires 96 of Al.

Further, over the wires 96 of Al and the oxide film 91, an SiN film 97 is formed with a thickness of about 200 nm by, for example, the plasma CVD method. Over the SiN film 97, an SiO film 98 is formed with a thickness of about 1.5 µm by, for example, the plasma CVD method. The SiO film 98 is etched to form via holes 99. Further, while rotating the silicon substrate 1 by a spin coater, a polyimide resin is applied on the SiO film 98 and the wires 96. The polyimide film is cured to form a polyimide layer 100, and thereafter the polyimide film is patterned using a mask formed of a resist film. Furthermore, bumps 101 are formed in the via holes 99. Thus, wires 83 of a portion of the fifth layer are electrically connected to the bumps 101 via the wires 96 of Al.

Thereafter, a back surface of the silicon substrate 1 is polished with a back grinder. The polishing is performed until the Cu film 28 in the through via hole 25 exposes on the back surface of the silicon substrate 1. Thus, a through electrode 110 penetrating the silicon substrate 1 is obtained.

Figure 4H:
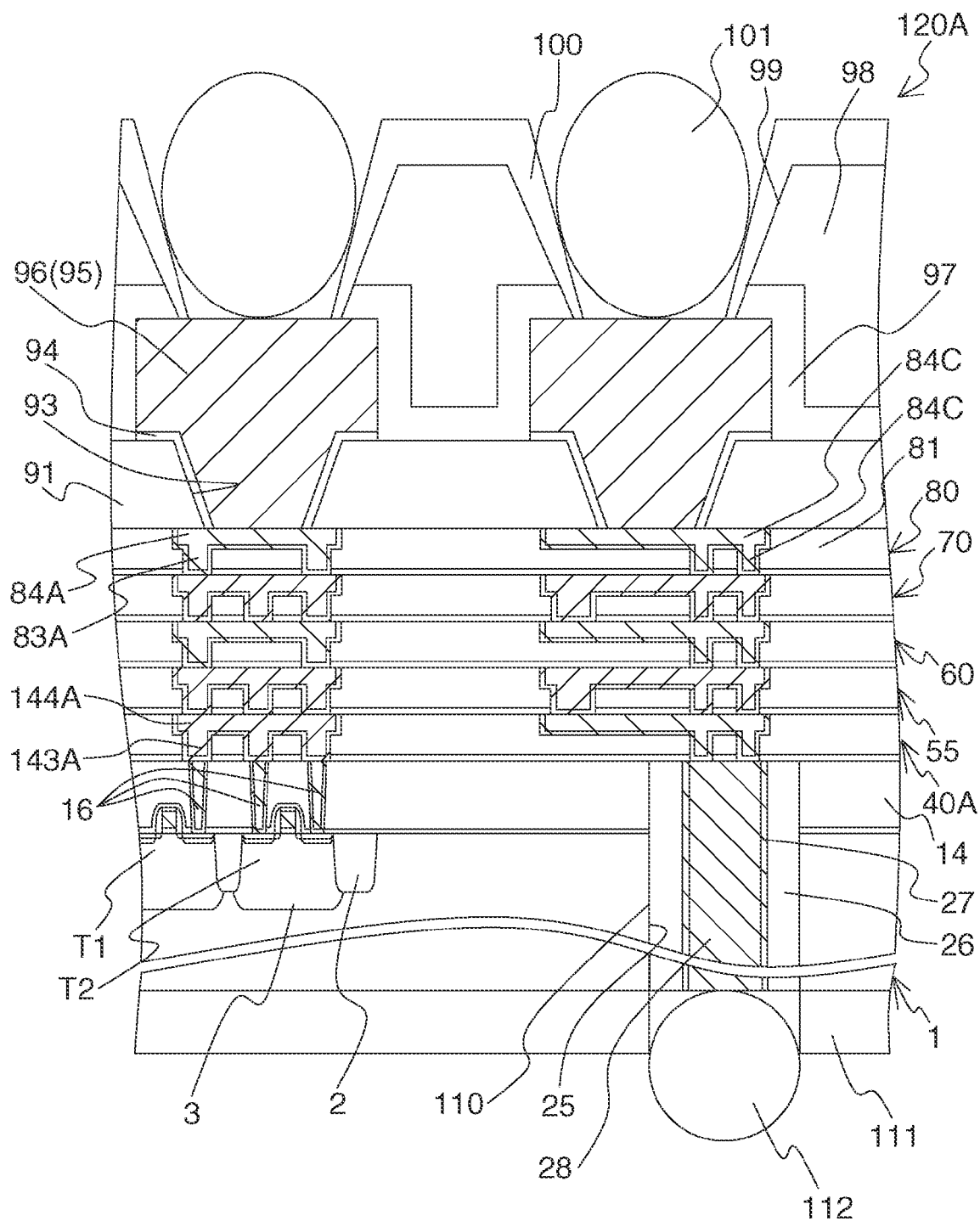

Next, processes until a cross-sectional structure illustrated in FIG. 4H is obtained will be described.

A polyimide resin is applied on the entire back surface of the silicon substrate 1 and cured to form a polyimide layer 111. Further, the polyimide layer 111 is patterned to expose the through electrode 110, and thereafter a bump 112 is electrically connected to an end surface of the back surface side of the through electrode 110. Thus, a semiconductor device 120A is manufactured.

As has been described above, in this method for manufacturing a semiconductor device, the oxide film 26 formed on the insulating film 14 is removed in steps through the processes of forming the through electrode 110. Thus, there are prevented remaining of the oxide film 26 on the insulating film 14 and over etching of the insulating film 14.

The oxide film 26B may be removed entirely when the contact holes 15 are dry etched. For example, when an embedding failure of the Cu film 36 will not occur such as when the wiring trenches 32 to 34 are shallow, the contact holes 15 may be formed without reducing the thickness of the oxide film 26B, and the oxide film 26B may be removed by polishing after the W film 16B is embedded in the contact holes 15. The through electrode 110 is connected to at least one wire of a multi-layer wiring structure formed above the silicon substrate 1.

Further, forming the via hole 25 and embedding the Cu film 28 may be performed after the contact holes 15 and the conductive plugs 16 are formed in the insulating film 14. In this case, polishing by the CMP method, dry etching, and polishing by the CMP method may be carried out in order to remove the oxide film 26 in steps. Further, polishing by the CMP method and dry etching may be carried out in order to remove the oxide film 26 in steps.

The time for polishing an oxide film is shortened, and a through electrode can be formed efficiently.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a semiconductor device, comprising:
   forming a semiconductor element over one surface of a substrate;
   forming a first insulating film over the semiconductor element;
   forming a hole penetrating the first insulating film and reaching into the substrate;
   forming a second insulating film over the first insulating film and on an inner surface of the hole;
   embedding a first conductive material in the hole;
   removing the first conductive material and a part of the second insulating film over the first insulating film by polishing;
   forming a pattern in the second insulating film and the first insulating film by etching the second insulating film and the first insulating film;
   embedding a second conductive material in the pattern;
   removing the second conductive film and the remaining second insulating film over the first insulating film by polishing to expose the first insulating film; and
   reducing a thickness of the substrate from the other surface to expose the first conductive material embedded in the hole.

2. The method for manufacturing a semiconductor device according to claim 1, wherein the forming the pattern comprises reducing a thickness of the second insulating film by etching.

3. The method for manufacturing a semiconductor device according to claim 2, further comprising, between the forming the semiconductor element and forming the first insulating film, forming a film in which a plug electrically connected to the semiconductor element is embedded, wherein
   the first insulating film is forming over the film in which the plug is embedded, and
   the embedding the second conductive material comprises forming a wire electrically connected to the plug.

4. The method for manufacturing a semiconductor device according to claim 3, wherein the hole is formed so as to penetrate the film in which the plug is embedded.

5. The method for manufacturing a semiconductor device according to claim 4, further comprising:
   forming a third insulating film over the first insulating film and the second conductive material; and
   forming a wire electrically connected to the second conductive material in the third insulating film.

6. The method for manufacturing a semiconductor device according to claim 3, further comprising:
   forming a third insulating film over the first insulating film and the second conductive material; and
   forming a wire electrically connected to the second conductive material in the third insulating film.

7. The method for manufacturing a semiconductor device according to claim 2, wherein the embedding the second conductive material comprises forming a plug electrically connected to the semiconductor element.

8. The method for manufacturing a semiconductor device according to claim 2, further comprising, between removing the second conductive film and the remaining second insulating film and reducing the thickness of the substrate, forming a plurality of wiring layers over the first insulating film.

9. The method for manufacturing a semiconductor device according to claim 8, wherein the first conductive material and the second conductive material are in contact with each other via at least a part of the plurality of wiring layers.

10. The method for manufacturing a semiconductor device according to claim 1, further comprising, between the forming the semiconductor element and forming the first insulating film, forming a film in which a plug electrically connected to the semiconductor element is embedded, wherein
the first insulating film is formed over the film in which the plug is embedded, and
the embedding the second conductive material comprises forming a wire electrically connected to the plug.

11. The method for manufacturing a semiconductor device according to claim 10, wherein the hole is formed so as to penetrate the film in which the plug is embedded.

12. The method for manufacturing a semiconductor device according to claim 11, further comprising:
forming a third insulating film over the first insulating film and the second conductive material; and
forming a wire electrically connected to the second conductive material in the third insulating film.

13. The method for manufacturing a semiconductor device according to claim 10, further comprising:
forming a third insulating film over the first insulating film and the second conductive material; and
forming a wire electrically connected to the second conductive material in the third insulating film.

14. The method for manufacturing a semiconductor device according to claim 1, wherein the embedding the second conductive material comprises forming a plug electrically connected to the semiconductor element.

15. The method for manufacturing a semiconductor device according to claim 1, further comprising, between removing the second conductive film and the remaining second insulating film and reducing the thickness of the substrate, forming a plurality of wiring layers over the first insulating film.

16. The method for manufacturing a semiconductor device according to claim 15, wherein the first conductive material and the second conductive material are in contact with each other via at least a part of the plurality of wiring layers.

* * * * *